US008613533B2

(12) United States Patent
Cho

(10) Patent No.: US 8,613,533 B2
(45) Date of Patent: Dec. 24, 2013

(54) OPTICAL SHEET AND LIGHT EMITTING DEVICE PACKAGE HAVING THE SAME

(75) Inventor: BumChul Cho, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 84 days.

(21) Appl. No.: 13/191,936

(22) Filed: Jul. 27, 2011

(65) Prior Publication Data

US 2012/0026720 A1    Feb. 2, 2012

(30) Foreign Application Priority Data

Jul. 28, 2010  (KR) .................. 10-2010-0072998

(51) Int. Cl.
  *F21V 5/02*  (2006.01)
  *F21V 9/16*  (2006.01)
  *G02B 5/02*  (2006.01)

(52) U.S. Cl.
  USPC ............. 362/339; 362/84; 362/330; 362/331; 359/599; 359/707

(58) Field of Classification Search
  USPC ............... 362/84, 330–340; 257/98; 359/599, 359/707, 831, 837
  See application file for complete search history.

(56) References Cited

U.S. PATENT DOCUMENTS

| 3,288,990 | A | * | 11/1966 | Stahlhut | 362/330 |
| 4,519,017 | A | * | 5/1985 | Daniel | 362/565 |
| 5,820,246 | A | * | 10/1998 | Helstern | 362/84 |
| 7,391,571 | B2 | * | 6/2008 | Lee et al. | 359/619 |
| 7,513,655 | B2 | * | 4/2009 | Chang | 362/332 |

FOREIGN PATENT DOCUMENTS

| CN | 101122703 A | 2/2008 |
| JP | 2010-056337 A | 3/2010 |
| KR | 10-2006-0049072 A | 5/2006 |
| KR | 10-2006-0066773 A | 6/2006 |
| KR | 10-2008-0087218 A | 10/2008 |

* cited by examiner

*Primary Examiner* — Alan Cariaso
(74) *Attorney, Agent, or Firm* — Birch, Stewart, Kolasch & Birch, LLP

(57) ABSTRACT

A light emitting device package is disclosed. The light emitting device package includes a body having a cavity, a light source mounted in the cavity, and at least one optical sheet located on the body to cover the cavity. The optical sheet includes a first layer and a second layer formed on the first layer, wherein the second layer includes a plurality of linear prism parts. At least one of the first layer and the second layer contains a light diffusive member. The light emitting device package has enhanced light emission efficiency and light distribution uniformity.

19 Claims, 13 Drawing Sheets

OPTICAL SHEET AND LIGHT EMITTING DEVICE PACKAGE HAVING THE SAME

CROSS-REFERENCE TO RELATED APPLICATION

This application claims the priority benefit of Korean Patent Application No. 10-2010-0072998, filed on Jul. 28, 2010 in the Korean Intellectual Property Office, the disclosure of which is incorporated herein by reference.

BACKGROUND

1. Field

Embodiments relate to an optical sheet and a light emitting device package having the same.

2. Description of the Related Art

Light Emitting Diodes (LEDs) are devices which convert electric signals into light using characteristics of compound semiconductors. Such LEDs are being utilized in home appliances, remote controllers, electric bulletin boards, displays and various other automated machines and the application range thereof is gradually increasing.

Generally, miniature LEDs are fabricated into surface mount devices so as to be directly mounted on a Printed Circuit Board (PCB) and hence, an LED lamp, which serves as a display device, is being developed into a surface mount device. The surface mount device can substitute for a conventional simple lamp and is used in a variety of color on-and-off displays and letter/image displays.

A light emitting device package with an LED employs a fluorescent substance pertaining to the LED in order to emit white light. However, precipitation of the fluorescent substance may deteriorate uniformity of chromaticity and the fluorescent substance may be transformed due to heat generated from the LED. Additionally, the light emitting device package emits light in a concentrative manner from the center thereof at which the LED is located, causing uneven light distribution.

SUMMARY

Therefore, embodiments provide an optical sheet, which enhances light efficiency and provide uniform light distribution, and a light emitting device package having the same.

In accordance with an aspect, embodiments provide a light emitting device package including a body having a cavity, a light source mounted in the cavity, and at least one optical sheet disposed on the body to cover the cavity, wherein the optical sheet includes a first layer, and a second layer formed on the first layer and which includes a plurality of linear prism parts, and wherein at least one of the first layer and the second layer contains a light diffusive member.

The light diffusive member may include reflective particles having light reflectivity.

The light diffusive member may be formed of at least one of gold, silver, copper and aluminum.

The light diffusive member may include voids.

The light diffusive member may include a first light diffusive member and a second a light diffusive member, and the first light diffusive member and the second light diffusive member may have different intrinsic colors.

The first layer may contain a first light diffusive member, the second layer may contain a second light diffusive member, and the first light diffusive member and the second light diffusive member may have different intrinsic colors.

At least one of the first layer and the second layer may contain a fluorescent substance.

The first layer may contain a first fluorescent substance, the second layer may contain a second fluorescent substance, and the first fluorescent substance and the second fluorescent substance may produce different wavelengths of light.

The linear prism parts may be arranged in parallel to define a prism pattern.

The linear prism parts may have a pitch of 30 μm to 70 μm.

The linear prism parts may have a height of 20 μm to 40 μm.

The optical sheet may further include a third layer formed beneath the first layer.

The third layer may contain at least one of a fluorescent substance and a light diffusive member.

The light emitting device package may further include a resin layer filled in the cavity and which has light transmittance.

The first layer may have a first index of refraction, the second layer may have a second index of refraction, and the first index of refraction may be equal to or greater than the second index of refraction.

The optical sheet may include a first optical sheet and a second optical sheet formed on the first optical sheet, the first optical sheet may include first prism parts arranged in a first direction, the second optical sheet may include second prism parts arranged in a second direction, and the first direction and the second direction may have a first angle therebetween.

In accordance with another aspect, there is provided an optical sheet including a first layer, and a second layer formed on the first layer and which includes a plurality of linear prism parts, wherein at least one of the first layer and the second layer contains a light diffusive member.

The light diffusive member may be formed of at least one of gold, silver, copper and aluminum.

At least one of the first layer and the second layer may contain a fluorescent substance.

The optical sheet may further include a third layer formed beneath the first layer.

BRIEF DESCRIPTION OF THE DRAWINGS

The embodiments will be more clearly understood from the following detailed description taken in conjunction with the accompanying drawings, in which.

DETAILED DESCRIPTION OF THE PREFERRED EMBODIMENTS

Figure 1:
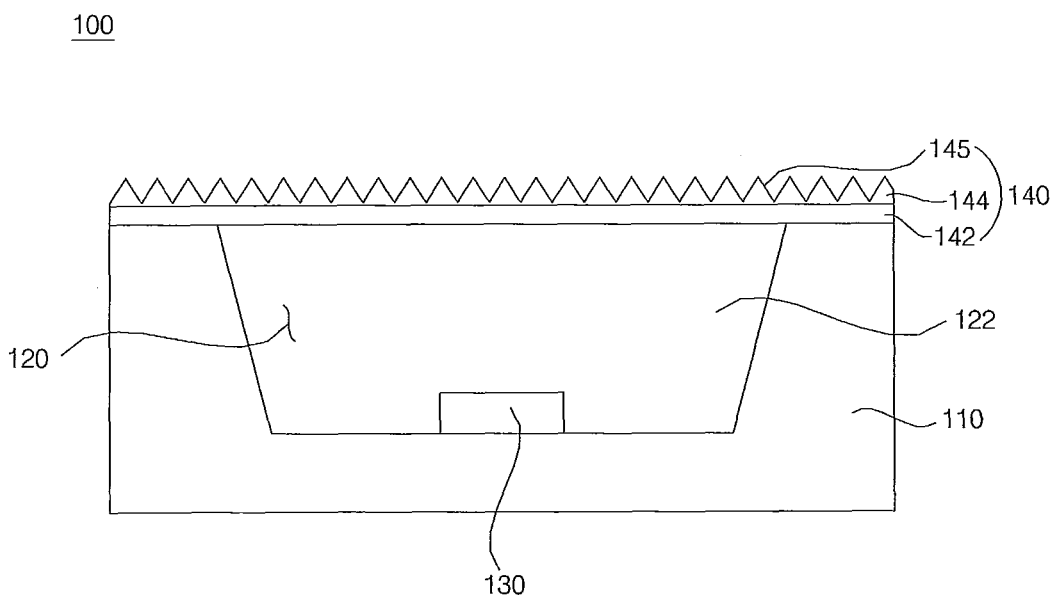
FIG. 1 is a sectional view showing the configuration of a light emitting device package in accordance with an embodiment.

Prior to description of the embodiments, it will be understood that, when an element is referred to as being formed "on" or "under" another element, it can be directly "on" or "under" the other element or be indirectly formed with intervening elements therebetween. Further, "on" or "under" of each element will be described based on illustration in the drawings.

In the drawings, the size of each element is exaggerated, omitted or schematically illustrated for clarity and convenience of description. Therefore, the size of each element does not wholly reflect actual size thereof. Wherever possible, the same reference numbers will be used throughout the drawings to refer to the same or like parts.

Hereinafter, exemplary embodiments will be described in more detail with reference to the accompanying drawings.

Figure 2:
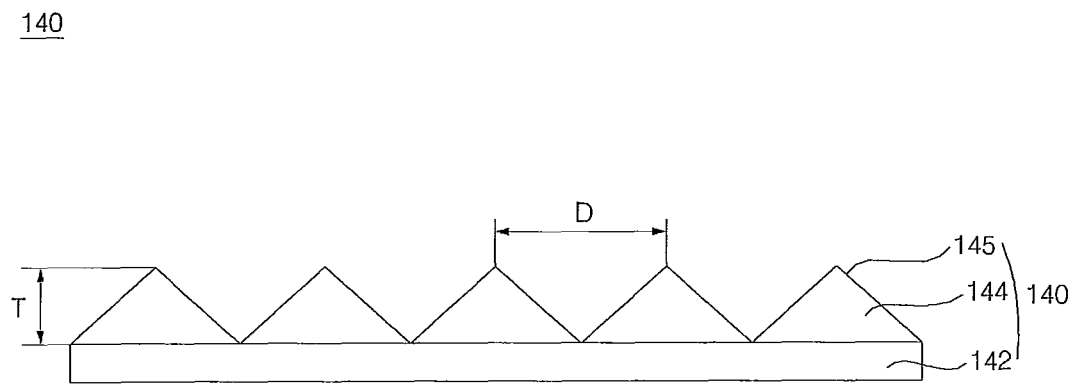
FIG. 2 is a sectional view showing the configuration of an optical sheet in accordance with an embodiment.
Figure 3:
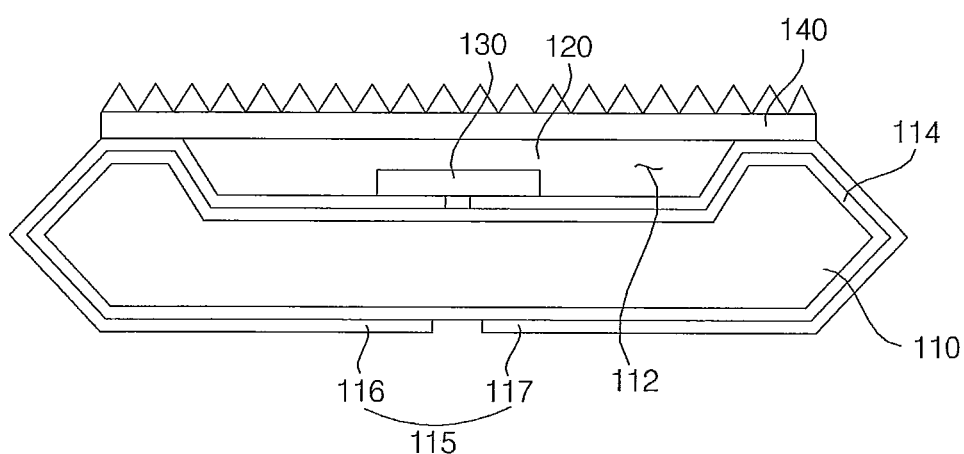
FIG. 3 is a sectional view showing the configuration of a light emitting device package in accordance with an embodiment.

Referring to FIGS. 1 to 3, a light emitting device package 100 in accordance with an embodiment includes a body 110 having a cavity 120, a light source 130 mounted in the cavity 120, and at least one optical sheet 140 disposed on the body 110 to cover the cavity 120. The optical sheet 140 may include a first layer 142 and a second layer 144 formed on the first layer 142, wherein the second layer 144 is provided with a plurality of linear prism parts 145. At least one of the first layer 142 and the second layer 144 may contain a light diffusive member (not shown).

The body 110 may be formed of at least one selected from among a resin such as Polyphthalamide (PPA), silicon (Si), aluminum (Al), aluminum nitride (AlN), a liquid crystal polymer such as photosensitive glass (PSG), polyamide 9T (PA9T), sindiotactic polystyrene (SPS), a metal, sapphire ($Al_2O_3$), beryllium oxide (BeO), and a Printed Circuit Board (PCB). The body 110 may be fabricated by injection molding, etching or the like, although the embodiment is not limited thereto.

The body 110 may have an inclined inner surface and thus, the reflection angle of light emitted from the light source 130 may be determined according to the inclination angle of the inner surface of the body 110. As such, the body 110 may function to adjust the orientation angle of light to be emitted to the outside.

The smaller the orientation angle of light, the greater the convergence of light emitted from the light source 130 to the outside. On the contrary, the greater the orientation angle of light, the smaller the convergence of light emitted from the light source 130 to the outside.

When viewing the cavity 120 formed in the body 110 from the upper side, the cavity 120 may have a circular, square, polygonal, elliptical shape or the like and may have rounded corners, although the embodiment is not limited thereto.

The light source 130 is mounted on the bottom of the body 110. In one example, the light source 130 may be a light emitting diode.

The light emitting diode may be a colored light emitting diode to emit, e.g., red, green, blue and white light, or an Ultra Violet (UV) light emitting diode to emit ultraviolet light, although the embodiment is not limited thereto. As occasion demands, one or more light emitting diodes may be mounted together.

The light emitting diode may be of a horizontal type wherein all electric terminals (not shown) are disposed on an upper surface thereof, or of a vertical type wherein electric terminals are distributed on upper and lower surfaces thereof.

Although not shown in the drawing, the body 110 may include an electrode. The electrode (not shown) may be electrically connected to the light source 130 to supply power to the light source 130.

The electrode (not shown) may be formed of a metal selected from among titanium (Ti), copper (Cu), nickel (Ni), gold (Au), chrome (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Hf), ruthenium (Ru), and iron (Fe), or alloys thereof. The electrode (not shown) may have a single layer or multilayer form, although the embodiment is not limited thereto.

The optical sheet 140 may be formed on the body 110. The optical sheet 140 may include the first layer 142 and the second layer 144 and the second layer 144 may be provided at an upper surface thereof with the plurality of linear prism parts 145.

In one example, the optical sheet 140 may be formed of a light transmissive material. For example, the optical sheet 140 may be formed of a resin selected from among polyethylene terephthalate, polycarbonate, polyethylene, polystyrene, polyester, polyether, epoxy, urethane, spyroacetyl, polybutadiene and polythiolpolyene, although the embodiment is not limited thereto.

The first layer 142 may serve as a support to enable formation of the second layer 144.

The second layer 144, which includes the plurality of linear prism parts 145 to refract light, may be formed on the first layer 142. The second layer 144 may be formed of an acrylic resin, although the embodiment is not limited thereto. For example, as described above, the second layer 144 may be formed of a resin selected from among polyethylene terephthalate, polycarbonate, polyethylene, polystyrene, polyester, polyether, epoxy, urethane, spyroacetyl, polybutadiene and polythiolpolyene. The second layer 144 may be integrally formed with the first layer 142 by use of the same material, although the embodiment is not limited thereto.

In one example, the linear prism parts 145 may be arranged adjacent to one another in parallel in a given direction to define a linear prism pattern, although the embodiment is not limited thereto. Each linear prism part 145 may have a triangular vertical cross section, although the embodiment is not limited thereto.

Referring to FIG. 2, a pitch D between the neighboring linear prism parts 145 of the second layer 144 may range from 30 μm to 70 μm, and a height T of the linear prism parts 145 may range from 20 μm to 40 μm. The first layer 142 and the second layer 144 may have the same index of refraction, although the embodiment is not limited thereto. The linear prism parts 145 may have an isosceles triangular form, which may more effectively increase dispersion of light.

By providing the optical sheet 140 including the plurality of linear prism parts 145 on the light emitting device package 100, the light emitting device package 100 may achieve enhanced brightness and uniform light distribution.

In some embodiments, at least one of the first layer 142 and the second layer 144 of the optical sheet 140 may contain a light diffusive member (not shown).

The light diffusive member (not shown) may include reflective particles having desired light reflectivity. For example, the light diffusive member may be formed of a metal, such as gold, silver, copper and aluminum, although the embodiment is not limited thereto.

The light diffusive member (not shown) may include voids in the form of air bubbles. The voids may have a different index of refraction from the optical sheet 140. Thus, when passing through the voids, light may be refracted by a certain angle.

The light source 130 emits light straightly and hence, the light is emitted in a concentrative manner from the center of the light emitting device package 100 where the light source 130 is located, which results in uneven light distribution. To solve this problem, i.e. to achieve uniform light distribution, it is necessary to increase the sizes of the body 110 and the cavity 120 of the light emitting device package 100. However, this may increase the size of the light emitting device package 100 and consequently, the size of a lighting apparatus (not shown), such as a backlight unit (not shown), including the light emitting device package 100.

In some embodiments, as the optical sheet 140 contains a light diffusive member (not shown), light emitted from the light source 130 is diffused while passing through the optical sheet 140, which provides the light emitting device package 100 with wider and more uniform light distribution, without requiring to increase the sizes of the body 110 and the cavity 120 for the purpose of uniform light distribution of the light emitting device package 100. Thus, even if the size of the light emitting device package 100 is reduced, it is possible to prevent uneven light distribution wherein the center of the light emitting device package 100 where the light source 130 is located seems brighter. In this way, fabrication of the light emitting device package 100 having a smaller thickness is possible, which enables realization of a slim backlight unit.

The light diffusive member (not shown) may contain a metal and may enhance light extraction efficiency of the light emitting device package 100 by virtue of surface plasmon resonance. This will be described later in detail with reference to FIGS. 4 to 6.

The optical sheet 140 may further include a third layer (not shown) formed at a lower surface of the first layer 142, and at least one of the first layer 142, the second layer 144 and the third layer (not shown) may contain a fluorescent substance (not shown).

When providing the fluorescent substance (not shown), the fluorescent substance (not shown) may be uniformly distributed, which may achieve uniformity of chromaticity of the light emitting device package 100 and may prevent the fluorescent substance (not shown) from being deteriorated by heat generated from the light source 130. This will be described later in detail with reference to FIGS. 7 to 10.

A resin layer 122 having light transmittance may be formed in the cavity 120. When providing the cavity 120 with the resin layer 122, it is possible to prevent damage to the light source 130 due to exterior impurities, moisture or the like.

The first layer 142 of the optical sheet 140 may have a first index of refraction and the resin layer 122 filled in the cavity 120 may have a second index of refection. The first index of reflection may be equal to or greater than the second index of refraction.

Based on Snell's law, when light travels from a material having a higher index of refraction to a material having a lower index of refraction, the light is totally reflected at an interface of the two materials having different indices of refraction if an incidence angle of the light is greater than a critical angle.

Thus, if the index of refraction of the resin layer 122 is greater than the index of refraction of the first layer 142, total reflection may occur at an interface between the resin layer 122 and the first layer 142 and light may be confined in the cavity 120, which may deteriorate light extraction efficiency of the light emitting device package 100.

In some embodiments, the index of refraction of the resin layer 122 is less than the index of refraction of the first layer 142, which may prevent total reflection at the interface between the resin layer 122 and the first layer 142 and may enhance light emission efficiency of the light emitting device package 100.

The resin layer 122 may be formed of silicon, epoxy and other resins. The resin layer 122 may be formed by filling the cavity 120 with a resin and hardening the resin by applying ultraviolet light or heat thereto.

In an embodiment, the light emitting device package 100, as illustrated in FIG. 3, may be a wafer level package.

Referring to FIG. 3, the light emitting device package 100 in accordance with the embodiment may include the body 110, an electrode layer 115 formed on the body 110, the electrode layer 115 consisting of a first electrode layer 116 and a second electrode layer 117, the light source (hereinafter, also referred to as a light emitting device) 130 installed on the body 110, the resin layer 112 surrounding the light emitting device 130, and the optical sheet 140 disposed on the light emitting device 130.

The body 110 may be formed of an electrically insulating material, for example, a resin, ceramic, silicon wafer or the like. In the embodiment, the body 110 is illustrated as being formed of a silicon wafer.

An upper surface of the body 110 may be selectively removed to provide the body 110 with the cavity 120 in the form of a recess. The light emitting device 130 ma be disposed in the cavity 120 and the resin layer 112 may be formed in the cavity 120.

An insulating layer 114 may be formed on the entire surface of the body 110. The insulating layer 114 prevents current leakage, thus serving to enhance electrical stability of the light emitting device package 100. For example, the insulating layer 114 may be formed of a silicon oxide film which is obtained by oxidizing the body 110, although the embodiment is not limited thereto.

The first electrode layer 116 and the second electrode layer 117 may be formed on the insulating layer 114 and may be electrically separated from each other. The first electrode layer 116 and the second electrode layer 117 may extend from a lower surface of the body 110 to the interior of the cavity 120 recessed in the upper surface of the body 110.

The light emitting device 130 may be disposed in the cavity 120 of the body 110 and may be electrically connected to the first electrode layer 116 and the second electrode layer 117. Although not shown, the light emitting device 130 may be electrically connected to the first electrode layer 116 and the second electrode layer 117 via at least one wire.

The resin layer 112 may be formed in the cavity 120 of the body 110 so as to surround the light emitting device 130. The resin layer 112 may be formed of silicon resin or epoxy resin, and may contain a fluorescent substance. The resin layer 112 may have a flat, concave or convex upper surface.

Figure 4:
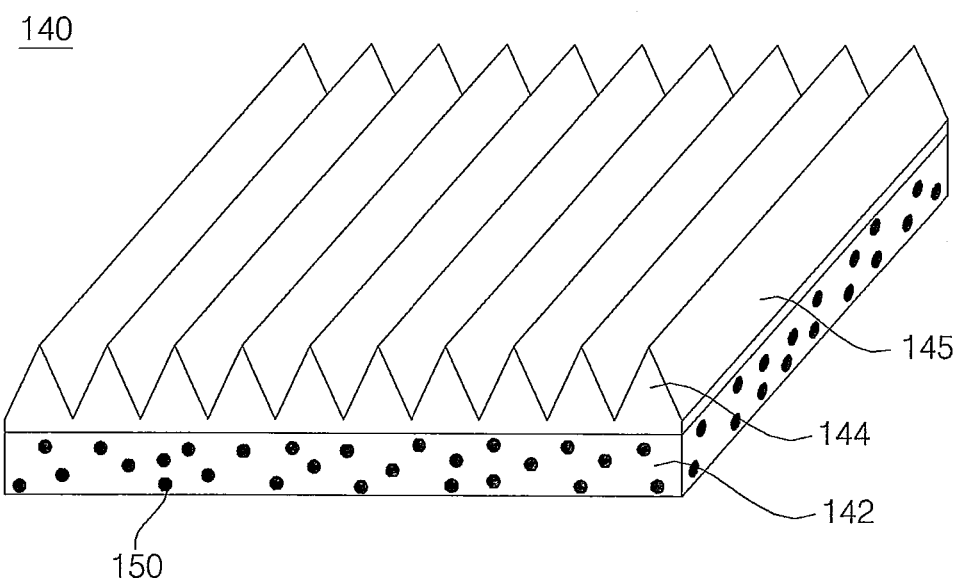
FIG. 4 is a perspective view showing the configuration of an optical sheet in accordance with an embodiment.
Figure 5:
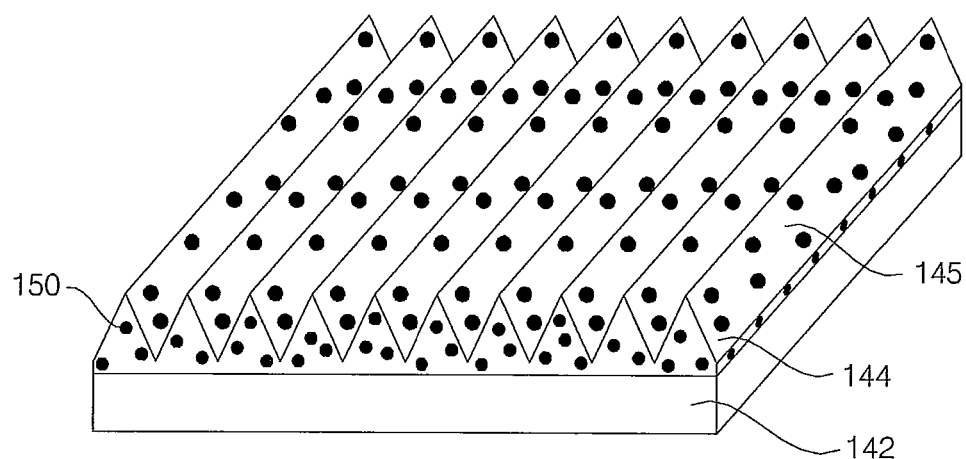
FIG. 5 is a perspective view showing the configuration of an optical sheet in accordance with an embodiment.
Figure 6:
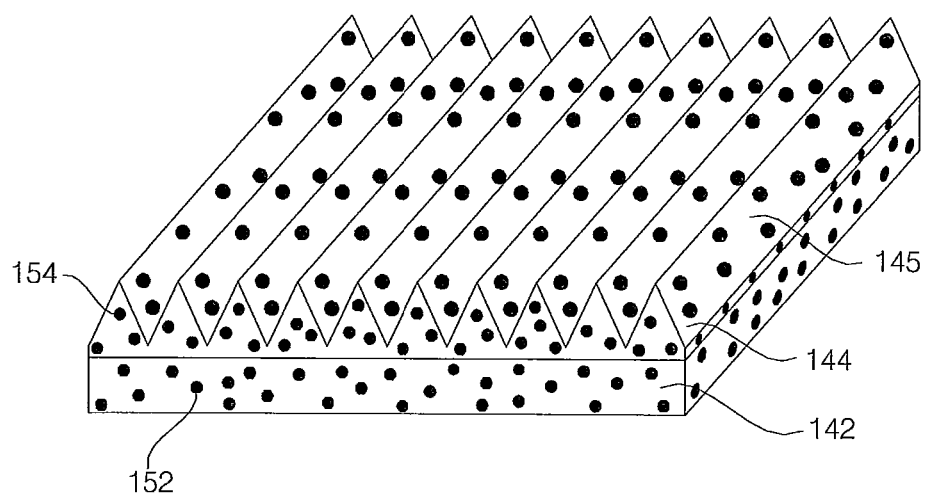
FIG. 6 is a perspective view showing the configuration of an optical sheet in accordance with an embodiment.

FIGS. 4 to 6 are perspective views illustrating the configuration of the optical sheet in accordance with different embodiments.

Referring to FIGS. 4 to 6, as described above, the optical sheet 140 in accordance with the embodiment may include the first layer 142 and the second layer 144 formed on the first layer 142.

The first layer 142 serves as a support to enable formation of the second layer 144 and is formed of a transparent material having good thermal stability. For example, the first layer 142 may be formed of a resin selected from among polyethylene terephthalate, polycarbonate, polyethylene, polystyrene, polyester, polyether, epoxy, urethane, spyroacetyl, polybutadiene and polythiolpolyene, although the embodiment is not limited thereto.

The second layer 144, which has a solid form, may be formed on the first layer 142 and serve to refract and condense light. The second layer 144 may be formed of a resin selected from among polyethylene terephthalate, polycarbonate, polyethylene, polystyrene, polyester, polyether, epoxy, urethane, spyroacetyl, polybutadiene and polythiolpolyene, in the same manner as the first layer 142, although the embodiment is not limited thereto.

The second layer 144 includes the plurality of linear prism parts 145, which are arranged adjacent to one another in parallel in a given direction on a surface of the first layer 142. A vertical cross section of each prism part with respect to an axial direction of the prism part may be a triangular shape, although the embodiment is not limited thereto.

In addition to affecting light condensing, the second layer 144 may determine a traveling direction of light according to an angular arrangement thereof. Thus, with provision of the optical sheet 140 attached to the light emitting device package 100, the light emitting device package 100 may achieve enhanced light straightness and ease in the adjustment of directivity of light.

At least one of the first layer 142 and the second layer 144 may contain a light diffusive member 150. FIG. 4 illustrates one embodiment in which the first layer 142 contains the light diffusive member 150, and FIG. 5 illustrates another embodiment in which the second layer 144 contains the light diffusive member 150. Of course, clearly, it is not excluded to provide both the first and second layers 142 and 144 with the light diffusive member 150 as illustrated in FIG. 6.

When providing the light diffusive member 150, the orientation angle of light emitted from the light emitting device package 100 increases, which may prevent concentration of light wherein a location where the light source 130 is located seems brighter, even if the light emitting device 100 has a small thickness.

The light diffusive member 150 may contain a metal. For example, the light diffusive member 150 may be formed of at least one of silver, gold, copper and aluminum. The metal light diffusive member 150 may enhance light extraction efficiency of the light emitting device package 100 by virtue of surface plasmon resonance.

Surface plasmon resonance may be caused by interaction of free electrons and light at an interface between the metal light diffusive member 150 and the first layer 142 or the second layer 144, a dielectric constant of which differs from that of the light diffusive member 150. That is, the resonance occurs at the interface when light energy transferred by photons of a dielectric material is transferred to free electrons present in a metal.

More particularly, surface plasmon resonance is a collective charge density oscillation of electrons occurring at metal surfaces. The resulting surface plasmon waves are electromagnetic surface waves moving along an interface between the light diffusive member 150 and the first layer 142 or the second layer 144, a dielectric constant of which differs from that of the light diffusive member 150.

If a metal layer has a flat surface, surface plasmon waves excited by light may not be propagated inward or outward from the metal surface. Therefore, it is necessary to discharge the surface plasmon waves to the outside. The light diffusive member 150 may have a solid shape, for example, a spherical shape and thus, may easily emit plasmon waves as light generated at the interface between the light diffusive member 150 and a dielectric base, i.e. the first layer 142 or the second layer 144.

To this end, as described above, the light diffusive member 150 are formed of a metal. For example, the light diffusive member 150 may be formed of at least one of gold, silver, copper and aluminum, which easily discharge electrons by external stimulation and have a negative dielectric constant.

The optical sheet 140 may contain at least two different kinds of light diffusive member 150, which have different intrinsic colors.

In one example, as illustrated in FIG. 6, the first layer 142 and the second layer 144 respectively contain a first light diffusive member 152 and a second light diffusive member 154. The first light diffusive member 152 and the second light diffusive member 154 may have different intrinsic colors. For example, the first light diffusive member 152 may be formed of gold, while the second light diffusive member 154 may be formed of silver. Providing plural kinds of light diffusive member having different intrinsic colors enables generation of light having various colors and various traveling directions, which may realize a variety of lighting environments.

FIGS. 7 to 10 are perspective views showing the configuration of the optical sheet in accordance with different embodiments.

In the following description, the first layer 142, the second layer 144 and the light diffusive member 150 are identical to those as described above with relation to FIGS. 4 to 6 and thus, a repeated description thereof will be omitted.

Figure 7:
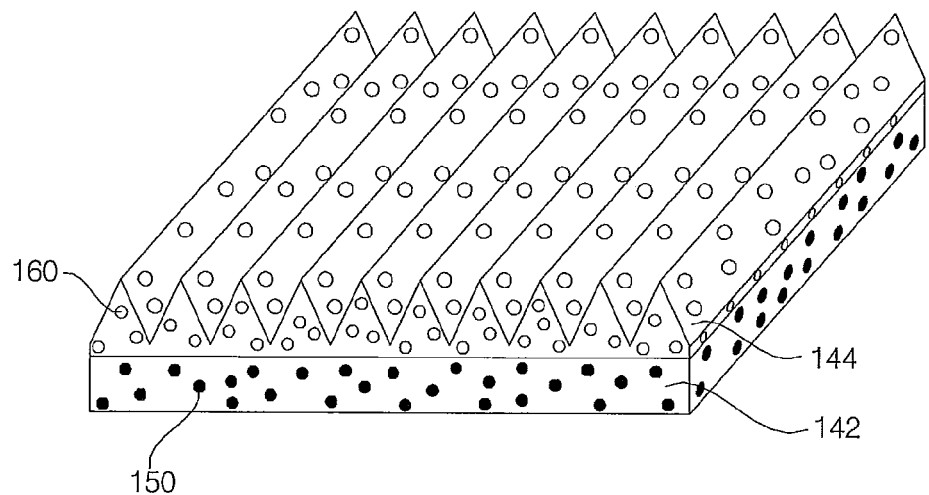
FIG. 7 is a perspective view showing the configuration of an optical sheet in accordance with an embodiment.
Figure 8:
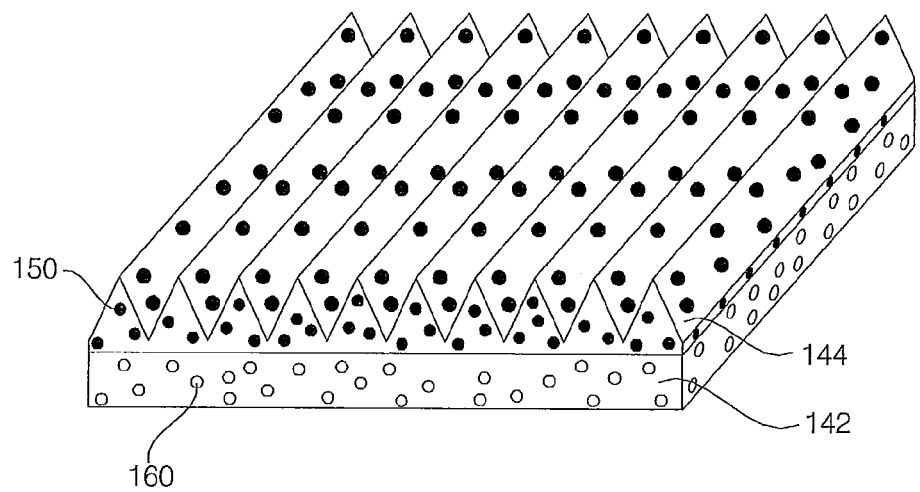
FIG. 8 is a perspective view showing the configuration of an optical sheet in accordance with an embodiment.

Referring to FIGS. 7 and 8, in the optical sheet 140 in accordance with the embodiment, at least one of the first layer 142 and the second layer 144 may contain a fluorescent substance 160.

More particularly, FIG. 7 illustrates one embodiment in which the first layer 142 contains the light diffusive member 150 and the second layer 144 contains the fluorescent substance 160, and FIG. 8 illustrates another embodiment in which the first layer 142 contains the fluorescent substance 160 and the second layer 144 contains the light diffusive member 150. Of course, the embodiments are not limited thereto and it is not excluded to provide the first layer 142 or the second layer 144 with both the light diffusive member 150 and the fluorescent substance 160. The fluorescent substance 160 may include plural kinds of fluorescent substances which emit different wavelength of light. For example, the first layer 142 may contain a first fluorescent substance (not shown) and the second layer 144 may contain a second fluorescent substance (not shown), although the embodiment is not limited thereto.

The kind of the fluorescent substance 160 is selected according to the wavelength of light emitted from the light source 130. In one example, the light emitting device package 100 of FIG. 1 may be realized to emit white light.

The fluorescent substance 160 may be any one of a blue light emitting fluorescent substance, a bluish green light emitting fluorescent substance, a green light emitting fluorescent substance, a yellow green light emitting fluorescent substance, a yellow light emitting fluorescent substance, a yellow red light emitting fluorescent substance, an orange light emitting fluorescent substance and a red light emitting fluorescent substance, according to the wavelength of light emitted from the light source 130.

More particularly, the fluorescent substance 160 may be excited by light having a first wavelength emitted from the light source 130 so as to produce light having a second wavelength. For example, if the light source 130 is a blue light emitting diode and the fluorescent substance 160 is a yellow fluorescent substance, the yellow fluorescent substance may be excited by green light and produce yellow light. With combination of the blue light generated from the blue light emitting diode and the yellow light generated via excitation by the blue light, the light emitting device package 100 may provide white light.

As other similar examples, a magenta fluorescent substance or a combination of blue and red fluorescent substances is used if the light source 130 is a green light emitting diode, and a cyan fluorescent substance or a combination of blue and green fluorescent substances is used if the light source 130 is a red light emitting diode.

The fluorescent substance 160 may be any known one, such as a YAG-based, TAG-based, sulfide-based, silicate-based, aluminate-based, nitride-based, carbide-based, nitridosilicate-based, borate-based, fluoride-based, or phosphate-based fluorescent substance.

Assuming that the first layer 142 contains the fluorescent substance 160, the first layer 142 may be formed by evenly distributing the fluorescent substance 160 in a material constituting the first layer 142 and then, hardening the same.

Assuming that the second layer 144 contains the fluorescent substance 160, the second layer 144 may be formed by making a paste or slurry mixture of the fluorescent substance 160 and acrylic resin and hardening the same, which may ensure uniform distribution of the fluorescent substance 160 in the second layer 144.

When providing the first layer 142 and/or the second layer 144 with the fluorescent substance 160, the fluorescent substance 160 may be uniformly distributed throughout the optical sheet 140. Accordingly, as the optical sheet 140 containing the fluorescent substance 160 is attached to the light emitting device package 100 as shown in FIG. 1, the light emitting device package 100 may achieve uniformity of chromaticity of light emitted therefrom and may prevent the fluorescent substance 160 from being deteriorated by heat generated from the light source 130 of FIG. 1.

Figure 9:
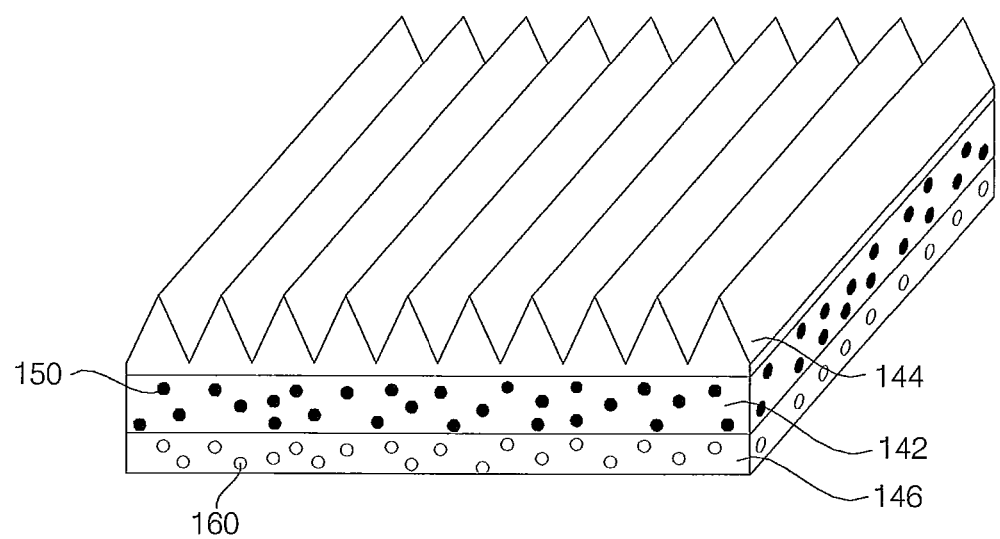
FIG. 9 is a perspective view showing the configuration of an optical sheet in accordance with an embodiment.
Figure 10:
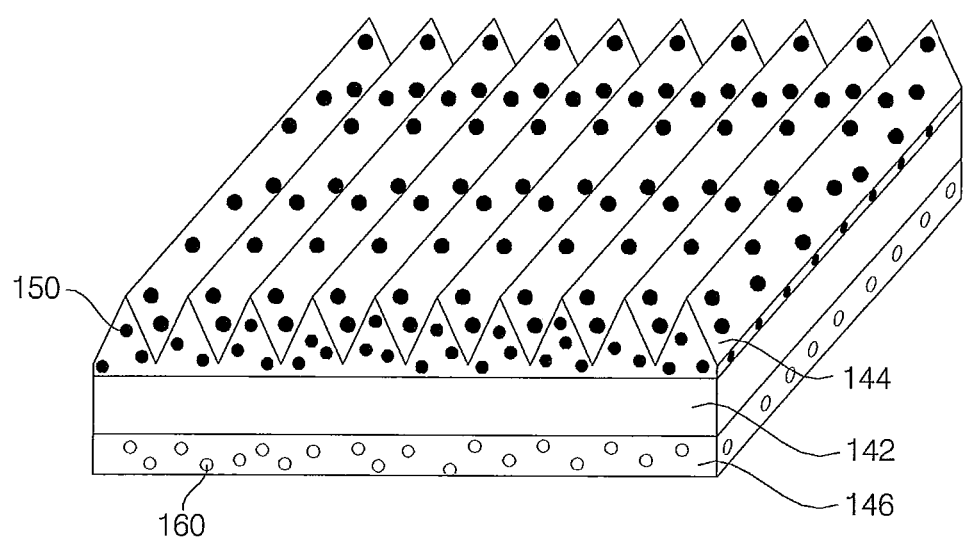
FIG. 10 is a perspective view showing the configuration of an optical sheet in accordance with an embodiment.

Referring to FIGS. 9 and 10, the optical sheet 140 may include a third layer 146 formed at a lower surface of the first layer 142, and the fluorescent substance 160 may be provided in the third layer 146.

The third layer 146 may serve to enhance heat resistance of the optical sheet 140 and may be formed by applying a resin, in which the fluorescent substance 160 is uniformly distributed, to the lower surface of the first layer 142 and hardening the same. Owing to uniform distribution of the fluorescent substance 160, thus, the light emitting device package 100 of FIG. 1 may exhibit uniformity of chromaticity of light.

A resin may serve to attach the fluorescent substance 160 to the lower surface of the first layer 142 and may be transparent acrylic resin having good heat resistance and mechanical properties. The acrylic resin is, for example, polyacrylate or polymethylmethacrylate, although the embodiment is not limited thereto.

The third layer 146 may serve not only prevent the optical sheet 140 from being deformed by heat generated from the light source 130 of FIG. 1, but also assist the optical sheet 140 in restoring to an original shape thereof at a room temperature even if the optical sheet 140 is deformed at a high temperature.

The third layer 126 may also provide the optical sheet 140 with resistance against scratches due to external shock or other physical forces.

Figure 11:
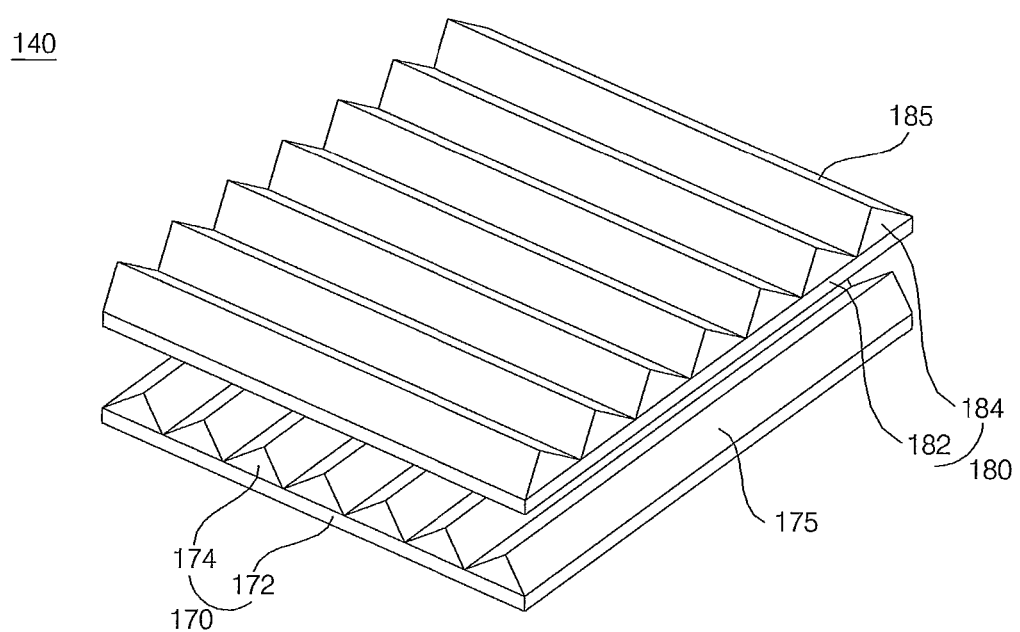
FIG. 11 is a perspective view showing the configuration of an optical sheet in accordance with an embodiment.

Referring to FIG. 11, in accordance with an embodiment, the optical sheet 140 may include a first optical sheet 170 and a second optical sheet 180.

The first optical sheet 170 may include a first layer 172 and a second layer 174 as described above and optionally, may further include a third layer (not shown). Similarly, the second optical sheet 180 may include a first layer 182 and a second layer 184 as described above and optionally, may further include a third layer (not shown).

The first optical sheet 170 and the second optical sheet 180 respectively may contain a light diffusive member (not shown) and a fluorescent substance (not shown), although the embodiment is not limited thereto.

The first optical sheet 170 and the second optical sheet 180 may be, for example, attached to each other by means of an adhesive, although the embodiment is not limited thereto.

The second layer 174 of the first optical sheet 170 may be provided with first linear prism parts 175 extending in a first direction, and the second layer 184 of the second optical sheet 180 may be provided with second linear prism parts 185 extending in a second direction, wherein the first direction and the second direction have a first angle therebetween. The first angle may be, for example, a right angle, although the embodiment is not limited thereto.

In the embodiment, when light emitted from the light source 130 is introduced into the first optical sheet 170 and the second optical sheet 180 and then, is reflected by the first optical sheet 170 and the second optical sheet 180 so as to be returned to the light source 130, the first and second optical sheets 170 and 180 allow 50% or more of the light to be again reflected upward, which results in enhanced light emission efficiency.

Furthermore, the first and second linear prism parts 175 and 185 formed on the first and second optical sheets 170 and 180 may increase refraction of light, which results in further enhanced light emission efficiency.

Figure 12A:
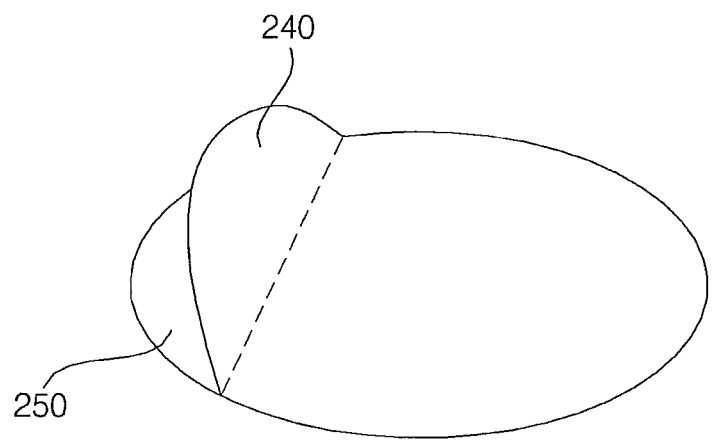
FIG. 12A is a view illustrating a manufacturing method of a light emitting device package in accordance with an embodiment.
Figure 12B:
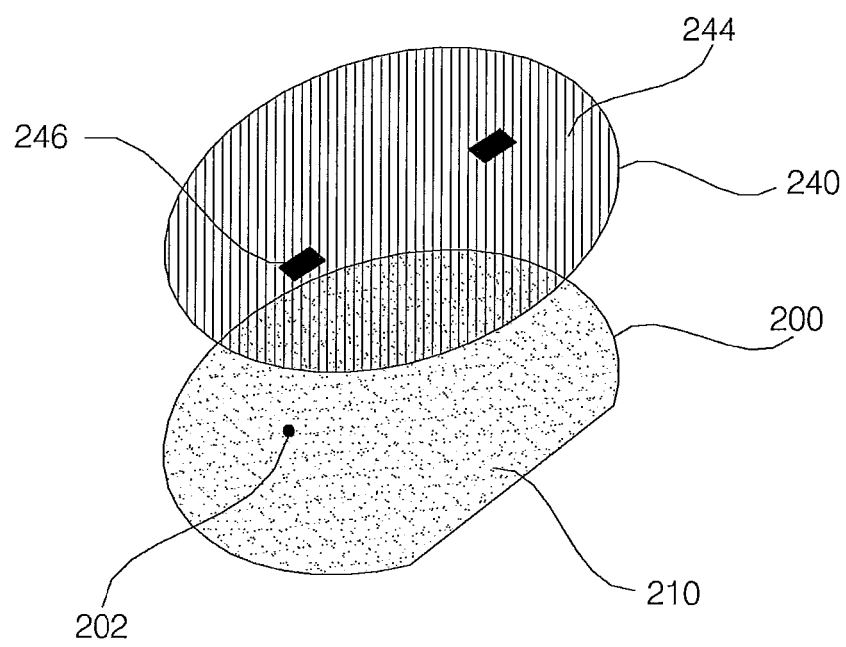
FIG. 12B is a view illustrating the manufacturing method of the light emitting device package in accordance with the embodiment.

FIGS. 12A and 12B illustrate a manufacturing method of a light emitting device package in accordance with an embodiment in brief.

Although FIGS. 12A and 12B illustrate the method of manufacturing the above described light emitting device package in the form of a wafer level package by way of example, the embodiment is not limited thereto. Clearly, the above described optical sheet may be individually attached to a single package.

In the exemplary method, as illustrated in FIG. 12A, an adhesive may be applied to a rear surface of an optical sheet 240 and a protective sheet 250 to protect the adhesive may be attached to the adhesive. Then, when in use, the protective sheet 250 is separable from the optical sheet 240, prior to attaching the optical sheet 240 to the silicon wafer 200.

FIG. 12B illustrates a method of attaching an optical sheet 240 to a silicon wafer 200. The silicon wafer 200 is obtained by etching a plurality of bodies 210 using anisotropic etching characteristics of silicon, mounting a light source in a cavity of each body 210 and filling the cavity with a sealing material.

The optical sheet 240 is attached to the silicon wafer 200 in such a manner that a prism pattern 244 faces upward. In this case, to align the optical sheet 240 with the silicon wafer 200, the optical sheet 240 is provided with a first alignment mark 246 and the silicon wafer 200 is provided with a second alignment mark 202 at a position corresponding to the first alignment mark 246.

After the first alignment mark 246 of the optical sheet 240 and the second alignment mark 202 of the silicon wafer 200 are aligned with each other, the optical sheet 240 is attached to the silicon wafer 200.

Examples of the method of attaching the optical sheet 240 to the silicon wafer 200 include a method of coating the plurality of bodies 210 formed on the silicon wafer 200 with an adhesive and thereafter, attaching and thermally treating the optical sheet 240, a method of positioning the optical sheet 240 on the silicon wafer 200 and thereafter, applying heat and pressure thereto, and a method of forming an adhesive pattern at a rear surface of the optical sheet 240 to suit the plurality of bodies 210 formed on the silicon wafer 200 and thereafter, attaching and thermally treating the optical sheet 240.

After the optical sheet 240 is attached to the silicon wafer 200 as described above, the silicon wafer 200 is cut along the plurality of bodies 210. In this way, the above described light emitting device package may be more easily manufactured.

Figure 13:
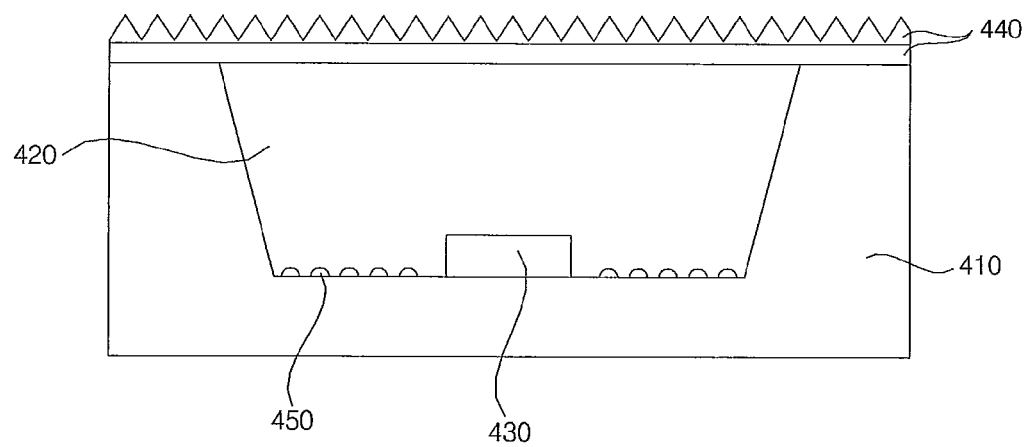
FIG. 13 is a sectional view showing the configuration of a light emitting device package in accordance with an embodiment.

FIG. 13 is a sectional view showing the cross sectional shape of a light emitting device package in accordance with an embodiment.

Referring to FIG. 13, a light emitting device package 400 may include a body 410 in which a cavity 420 is formed, a light source 430 mounted on the bottom of the body 410, and an optical sheet 440 located on the body 410 to cover the cavity 420. The body 410, the light source 430 and the optical sheet 440 are identical to those as illustrated and described with reference to FIGS. 1 to 12 and thus, only a difference will be described hereinafter.

The light emitting device package 400 of FIG. 13 may further include bosses 450 formed on the bottom of the body 410 on which the light source 430 is mounted.

The bosses 450 may have an even shape and a predetermined pattern, or may have irregular shapes.

The bosses 450 serve to scatter light emitted from the light source 430, which provides the light emitting device package 400 with a wider viewing angle and assures easy color mixing. Thus, when a plurality of light emitting device packages 400 is connected to one another to define an array, colors of the respective light emitting device packages 400 may be naturally mixed, resulting in enhanced color rendition.

Although not shown, the bosses 450 may be replaced by recesses, or the bosses 450 and the recesses may be used together.

Figure 14:
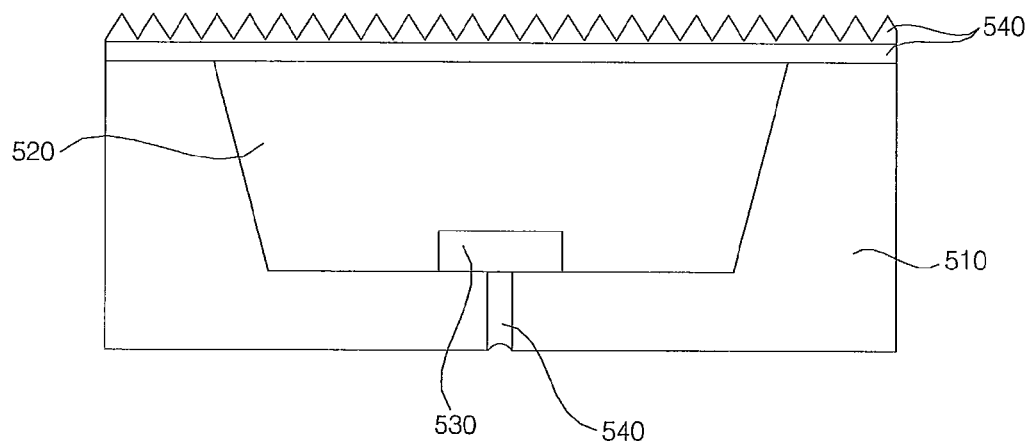
FIG. 14 is a sectional view showing the configuration of a light emitting device package in accordance with an embodiment.

FIG. 14 is a sectional view showing the configuration of a light emitting device package in accordance with an embodiment.

A body 510 in which a cavity 520 is formed, a light source 530 and an optical sheet 540 are identical to those as illustrated and described with reference to FIGS. 1 to and thus, only a difference will be described hereinafter.

The light emitting device package 500 shown in FIG. 14 may have a hole 540 perforated in the bottom of the body 510 and the hole 540 may be located immediately below the light source 530.

The light source 530 may be a light emitting diode, which may be electrically connected to an electrode (not shown) formed at the body 510.

In this case, the light source 530 and the electrode (not shown) may be electrically connected to each other through the hole 540.

In addition to serving as the above described electric connector, the hole 540 may also serve as a heat sink to radiate heat generated from the light source 530 to the outside.

Although not shown in the drawing, the hole 540 may be connected to a metallic radiator (not shown) located below the hole 540. Connecting the hole 540 to the metallic radiator having superior heat radiation characteristics may result in further enhanced heat radiation efficiency.

Figure 15:
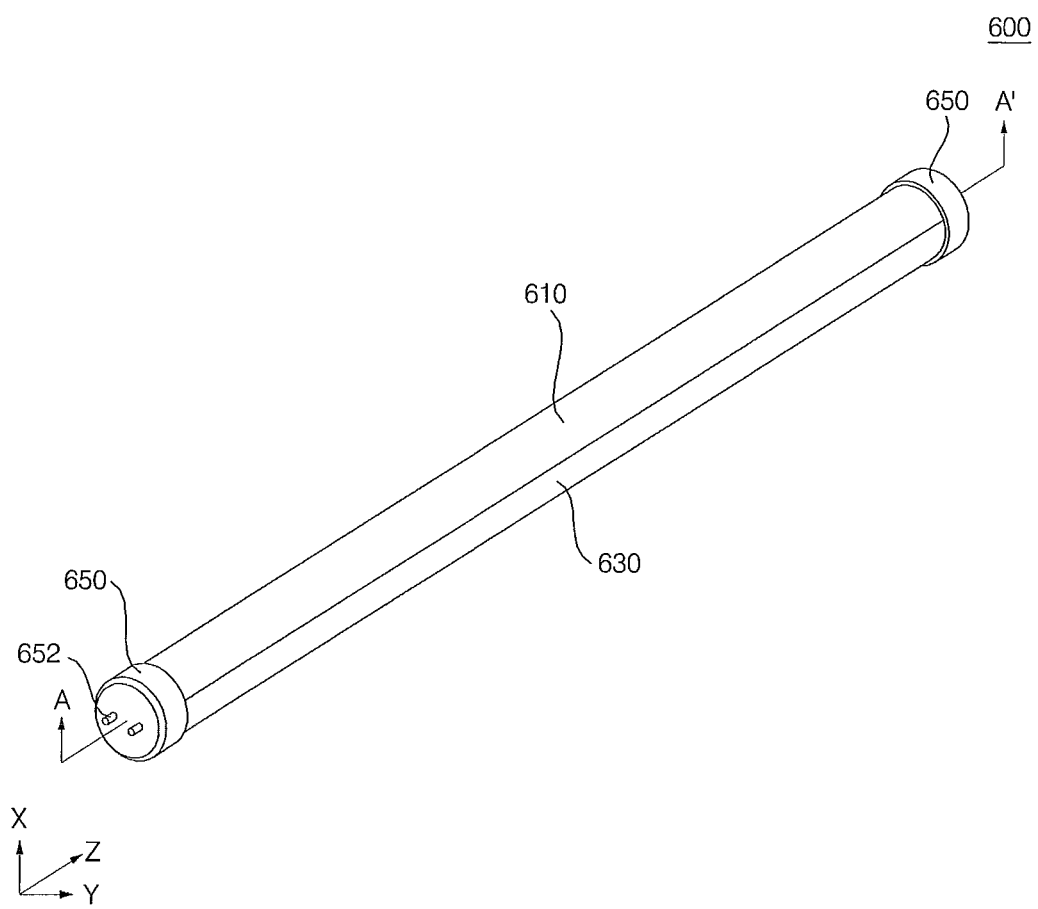
FIG. 15 is a perspective view showing a lighting apparatus including a light emitting device package in accordance with an embodiment.
Figure 16:
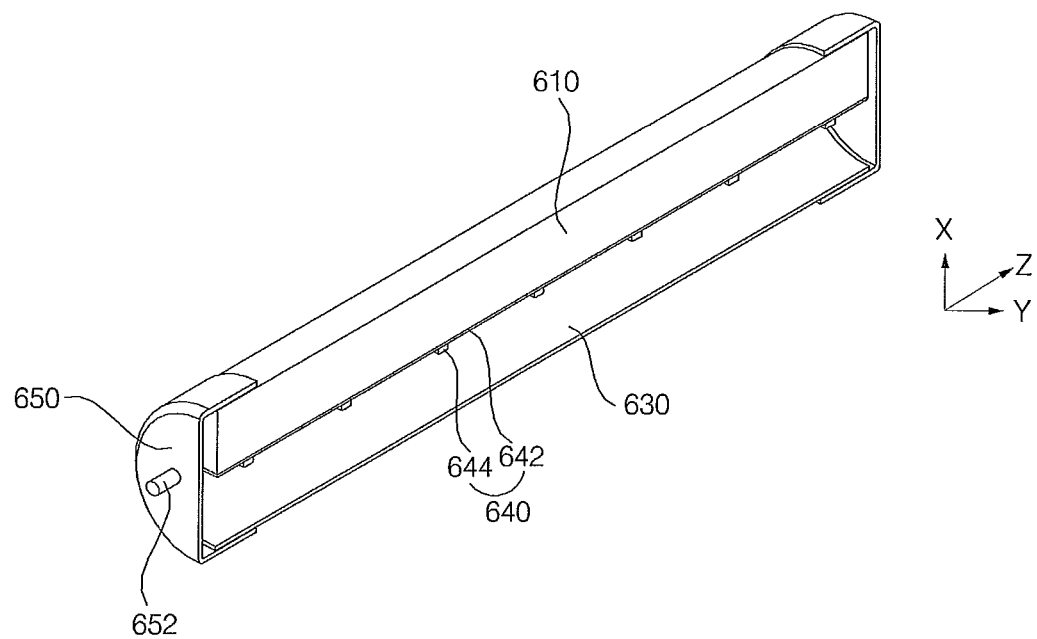
FIG. 16 is a sectional view taken along the line A-A' showing the lighting apparatus of FIG. 15.

FIG. 15 is a perspective view showing a lighting apparatus including a light emitting device package in accordance with an embodiment, and FIG. 16 is a sectional view taken along the line A-A' showing the lighting apparatus of FIG. 15.

In the following description, to explain the shape of the lighting apparatus 600 in accordance with the embodiment in more detail, on the basis of a longitudinal direction Z of the lighting apparatus 600, a direction perpendicular to the longitudinal direction Z is referred to as a horizontal direction Y, and a direction perpendicular to both the longitudinal direction Z and horizontal direction Y is referred to as a height direction X.

FIG. 16 is a sectional view showing a Z-X plane of the lighting apparatus 600 of FIG. 15 as viewed in the horizontal direction Y.

Referring to FIGS. 15 and 16, the lighting apparatus 600 may include a main body 610, a cover 630 coupled to the main body 610, and end caps 650 located at both ends of the main body 610.

A light emitting device module 640 is coupled to a lower surface of the main body 610. The main body 610 may be formed of a high conductivity and high thermal conductivity metal to radiate heat generated from light emitting device packages 644 to the outside through an upper surface of the main body 610.

The light emitting device packages 644 may be mounted in multiple rows on a PCB 642 to define a multi-color array. The light emitting device packages 644 may be mounted at the same distance, or may be mounted at different distances if necessary, which enables adjustment of brightness. The PCB 642 may be a Metal Core PCB (MCPCB) or an FR4 PCB.

The light emitting device packages 644 respectively may include an optical sheet containing a light diffusive member and/or a fluorescent substance.

Providing the optical sheet with the light diffusive member may assure wider light diffusion and in particular, may enhance light extraction efficiency of the light emitting device package 644 owing to surface plasmon resonance, which may result in enhanced light emission efficiency of the lighting apparatus 600. Further, providing the optical sheet with the fluorescent substance at uniform distribution may provide the light emitting device package 644 with uniformity of chromaticity.

The cover 630 may have a circular shape suitable to surround the lower surface of the main body 610, although the embodiment is not limited thereto.

The cover 630 serves to protect the light emitting device module 640 therein from external impurities, etc. The cover 630 may contain a light diffusive member to achieve antiglaring effects and uniform emission of light generated from the light emitting device packages 644. At least one of an inner surface and an outer surface of the cover 630 may be provided with a prism pattern. Also, a fluorescent substance may be applied to at least one of the inner surface and the outer surface of the cover 630.

In consideration of the fact that light generated from the light emitting device packages 644 is emitted to the outside through the cover 630, the cover 630 must have high light transmittance and heat resistance sufficient to endure heat generated from the light emitting device packages 644. To this end, the cover 630 may be formed of polyethylene terephthalate (PET), polycarbonate (PC) or polymethylmethacrylate (PMMA).

The end caps 650 may be located at both ends of the main body 610 and serve to seal a power device (not shown) provided in the main body 610. The end caps 650 are provided with power pins 652, which allows the lighting apparatus 600 in accordance with the embodiment to be directly connected to a terminal without an additional connector.

Figure 17:
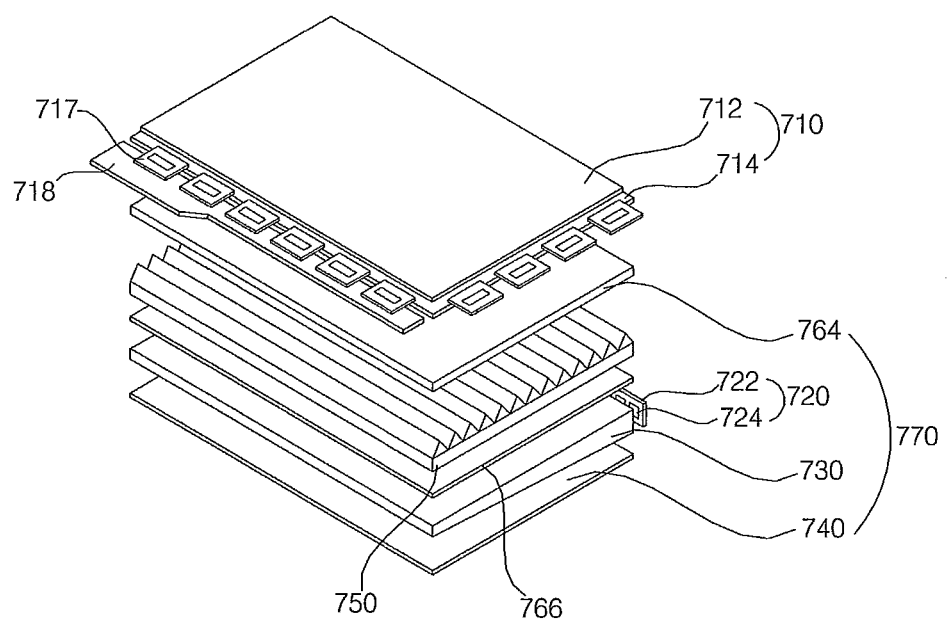
FIG. 17 is an exploded perspective view showing a liquid crystal display apparatus including a light emitting device package in accordance with an embodiment.

FIG. 17 is an exploded perspective view showing a liquid crystal display apparatus including a light emitting device package in accordance with an embodiment.

FIG. 17 illustrates an edge-light type liquid crystal display apparatus 700 including a liquid crystal display panel 710 and a backlight unit 770 to supply light to the liquid crystal display panel 710.

The liquid crystal display panel 710 may display an image using the light supplied from the backlight unit 770. The liquid crystal display panel 710 may include a color filter substrate 712 and a thin film transistor substrate 714, which are opposite each other with liquid crystals interposed therebetween.

The color filter substrate 712 may realize the color of the image displayed via the liquid crystal display panel 710.

The thin film transistor substrate 714 is electrically connected to a printed circuit board 718, on which a plurality of circuit elements is mounted, by means of a drive film 717. The thin film transistor substrate 714 may apply drive voltage provided by the printed circuit board 718 to the liquid crystals in response to a drive signal transmitted from the printed circuit board 718.

The thin film transistor substrate 714 may include pixel electrodes and thin film transistors in the form of thin films formed on a substrate formed of a transparent material, such as glass, plastic or the like.

The backlight unit 770 includes a light emitting device module 720 to emit light, a light guide plate 730 to change light emitted from the light emitting device module 720 into planar light and transmit the planar light to the liquid crystal display panel 710, a plurality of films 750, 766 and 764 to achieve uniformity in brightness distribution and improve vertical light incidence of the light having passed through the light guide plate 730, and a reflective sheet 740 to reflect light, emitted rearward from the light guide plate 730, toward the light guide plate 730.

The light emitting device module 720 may include a plurality of light emitting device packages 724 and a PCB 722 on which the plurality of light emitting device packages 724 is mounted to define an array.

In particular, each light emitting device package 724 may include an optical sheet containing a light diffusive member and/or a fluorescent substance. In particular, providing the optical sheet with the light diffusive member may improve haze properties of the light emitting device package 724, which results in enhanced brightness uniformity even if the thickness of the light emitting device package 724 is reduced. Accordingly, the backlight unit 700 may achieve a slim design.

In addition, the light emitting device package 724 may achieve not only enhanced light extraction efficiency owing to surface plasmon resonance, but also uniformity of chromaticity owing to provision of the uniformly distributed fluorescent substance.

The backlight unit 770 may include the diffusive film 766 to diffuse the light directed from the light guide plate 730 toward the liquid crystal display panel 710, and a prism film 750 to condense the diffused light so as to enhance vertical light incidence. The backlight unit 770 may further include the protective film 764 to protect the prism film 750.

Figure 18:
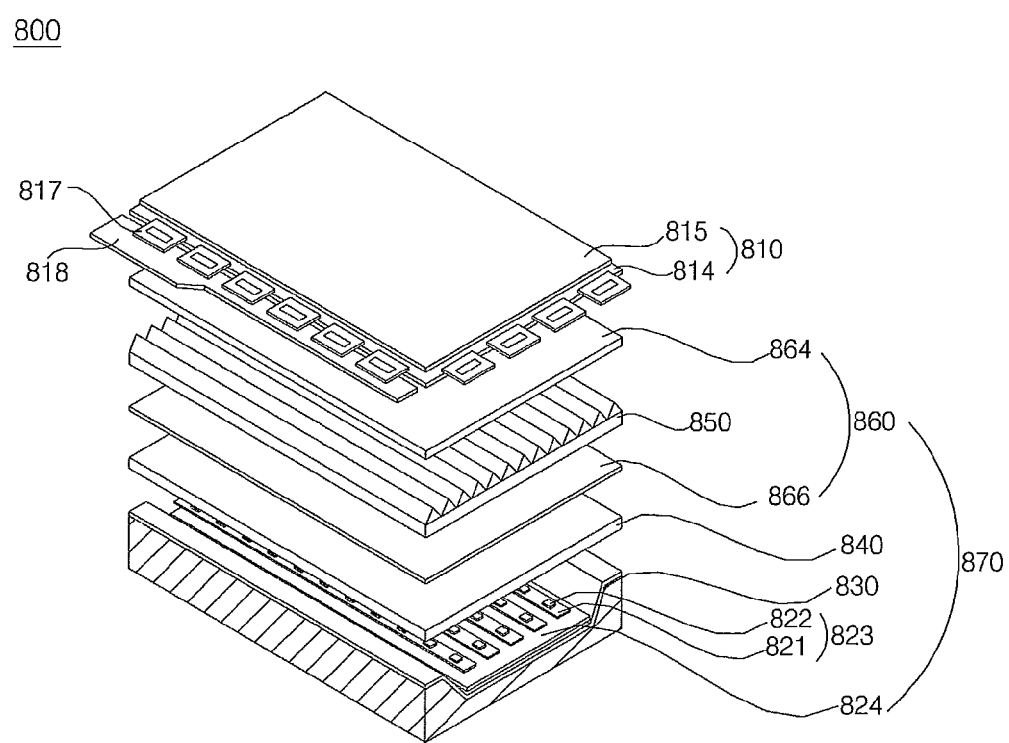
FIG. 18 is an exploded perspective view showing a liquid crystal display apparatus including a light emitting device package in accordance with an embodiment.

FIG. 18 is an exploded perspective view showing a liquid crystal display apparatus including a light emitting device package in accordance with an embodiment. The same configuration as that illustrated and described in FIG. 17 will not be repeated hereinafter.

FIG. 18 illustrates a direct type liquid crystal display apparatus 800 including a liquid crystal display panel 810 and a backlight unit 870 to supply light to the liquid crystal display panel 810.

The liquid crystal display panel 810 is identical to that as described in FIG. 17 and thus, a detailed description thereof will be omitted.

The backlight unit 870 includes a plurality of light emitting device modules 823, a reflective sheet 824, a lower chassis 830 in which the light emitting device modules 823 and the reflective sheet 824 are accommodated, and a diffusive plate 840 and a plurality of optical films 860 disposed over the light emitting device modules 823.

Each of the light emitting device modules 823 may include a plurality of light emitting device packages 822 and a PCB 821 on which the plurality of light emitting device packages 822 is mounted to define an array.

In particular, each light emitting device package 822 may include an optical sheet containing a metallic light diffusive member and/or a fluorescent substance, which may provide the light emitting device package 822 with enhanced light extraction efficiency, higher brightness and light distribution uniformity.

The reflective sheet 824 serves to reflect light, generated from the light emitting device packages 822, toward the liquid crystal display panel 810, which results in enhanced light utilization efficiency.

The light generated from the light emitting device modules 823 is introduced into the diffusive plate 840. The optical films 860 are disposed above the diffusive plate 840. The optical films 860 include a diffusive film 866, a prism film 850 and a protective film 864.

It is noted that the configuration of the light emitting device package and the manufacturing method thereof are not limited to the above described embodiments and all or a part of the embodiments may be selectively combined with one another to realize various modifications.

Although the exemplary embodiments have been disclosed for illustrative purposes, those skilled in the art will appreciate that various modifications, additions and substitutions are possible, without departing from the scope and spirit of the embodiments as disclosed in the accompanying claims.

What is claimed is:

1. A light emitting device package comprising:
a body having a cavity;
a light source mounted in the cavity; and
at least one optical sheet disposed on the body to cover the cavity, wherein the optical sheet includes a first layer, and a second layer formed on the first layer and which includes a plurality of linear prism parts, wherein at least one of the first layer and the second layer contains a light diffusive member, wherein the light diffusive member includes a first light diffusive member and a second light diffusive member, and the first light diffusive member and the second light diffusive member have different intrinsic colors.

2. The light emitting device package according to claim 1, wherein the light diffusive member includes reflective particles having light reflectivity.

3. The light emitting device package according to claim 1, wherein the light diffusive member is formed of at least one of gold, silver, copper and aluminum.

4. The light emitting device package according to claim 1, wherein the light diffusive member includes voids.

5. The light emitting device package according to claim 1, wherein:

the first layer contains a first light diffusive member;
the second layer contains a second light diffusive member; and
the first light diffusive member and the second light diffusive member have different intrinsic colors.

6. The light emitting device package according to claim 1, wherein at least one of the first layer and the second layer contains a fluorescent substance.

7. The light emitting device package according to claim 1, wherein:

the first layer contains a first fluorescent substance;
the second layer contains a second fluorescent substance; and
the first fluorescent substance and the second fluorescent substance produce different wavelengths of light.

8. The light emitting device package according to claim 1, wherein the linear prism parts are arranged in parallel to define a prism pattern.

9. The light emitting device package according to claim 1, wherein the linear prism parts have a pitch of 30 µm to 70 µm.

10. The light emitting device package according to claim 1, wherein the linear prism parts have a height of 20 µm to 40 µm.

11. The light emitting device package according to claim 1, wherein the optical sheet further includes a third layer formed beneath the first layer.

12. The light emitting device package according to claim 11, wherein the third layer contains at least one of a fluorescent substance and light diffusive member.

13. The light emitting device package according to claim 1, further comprising a resin layer filled in the cavity and which has light transmittance.

14. The light emitting device package according to claim 13, wherein:

the first layer has a first index of refraction;
the second layer has a second index of refraction; and
the first index of refraction is equal to or greater than the second index of refraction.

15. A light emitting device package comprising:

a body having a cavity;
a light source mounted in the cavity; and
at least one optical sheet disposed on the body to cover the cavity, wherein the optical sheet includes a first layer, and a second layer formed on the first layer and which includes a plurality of linear prism parts, and wherein at least one of the first layer and the second layer contains a light diffusive member;

wherein the optical sheet includes a first optical sheet and a second optical sheet formed on the first optical sheet;

the first optical sheet includes first prism parts arranged in a first direction;

the second optical sheet includes second prism parts arranged in a second direction; and the first direction and the second direction have a first angle therebetween.

16. An optical sheet comprising:

a first layer; and
a second layer formed on the first layer and which includes a plurality of linear prism parts, wherein at least one of the first layer and the second layer contains a light diffusive member, wherein the light diffusive member includes a first light diffusive member and a second light diffusive member, and the first light diffusive member and the second light diffusive member have different intrinsic colors.

17. The optical sheet according to claim 16, wherein the light diffusive member is formed of at least one of gold, silver, copper and aluminum.

18. The optical sheet according to claim 16, wherein at least one of the first layer and the second layer contains a fluorescent substance.

19. The optical sheet according to claim 16, further comprising a third layer formed beneath the first layer.

\* \* \* \* \*